(12) United States Patent
Pavier et al.

(10) Patent No.: US 9,362,221 B2
(45) Date of Patent: Jun. 7, 2016

(54) SURFACE MOUNTABLE POWER COMPONENTS

(71) Applicant: International Rectifier Corporation, El Segundo, CA (US)

(72) Inventors: Mark Pavier, Felbridge (GB); Daniel Cutler, Betchworth (GB); Scott Palmer, Brighton (GB); Clive O'Dell, Surrey (GB); Rupert Burbidge, Surrey (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/688,344

(22) Filed: Apr. 16, 2015

(65) Prior Publication Data

US 2015/0221588 A1 Aug. 6, 2015

Related U.S. Application Data

(63) Continuation of application No. 14/018,238, filed on Sep. 4, 2013, now Pat. No. 9,012,990.

(60) Provisional application No. 61/715,129, filed on Oct. 17, 2012.

(51) Int. Cl.

| H01L 25/00 | (2006.01) |
|---|---|
| H01L 27/00 | (2006.01) |
| H01L 23/522 | (2006.01) |
| H01L 29/739 | (2006.01) |
| H01L 23/498 | (2006.01) |
| H01L 25/07 | (2006.01) |
| H01L 27/06 | (2006.01) |

(52) U.S. Cl.
CPC ........ *H01L 23/522* (2013.01); *H01L 23/49811* (2013.01); *H01L 25/072* (2013.01); *H01L 27/0647* (2013.01); *H01L 29/7393* (2013.01); *H01L 2924/0002* (2013.01)

(58) Field of Classification Search
CPC ................... H01L 2924/0002; H01L 2924/00; H01L 23/522; H01L 23/49811; H01L 27/0647; H01L 29/7393; H01L 25/072
See application file for complete search history.

(56) References Cited

U.S. PATENT DOCUMENTS

| 5,757,081 A | * | 5/1998 | Chang et al. | 257/778 |
| 6,324,072 B1 | * | 11/2001 | Lorenz et al. | 361/803 |
| 6,429,491 B1 | * | 8/2002 | Schnaitter | 257/362 |
| 2002/0070408 A1 | * | 6/2002 | Schnaitter | 257/356 |

* cited by examiner

*Primary Examiner* — Nikolay Yushin
(74) *Attorney, Agent, or Firm* — Farjami & Farjami LLP (57) ABSTRACT

According to an exemplary implementation, a power component includes a component substrate and a power semiconductor device electrically and mechanically coupled to the component substrate. The power component also includes at least one first peripheral contact and at least one second peripheral contact situated on the component substrate. A power semiconductor device is situated between the at least one first peripheral contact and the at least one second peripheral contact. The at least one first peripheral contact, the at least one second peripheral contact, and a surface electrode of the power semiconductor device are configured for surface mounting. The at least one first peripheral contact can be electrically coupled to the power semiconductor device.

20 Claims, 6 Drawing Sheets

SURFACE MOUNTABLE POWER COMPONENTS

This is a continuation of application Ser. No. 14/018,238 filed Sep. 4, 2013, which itself claims priority to U.S. provisional application Ser. No. 61/715,129, filed Oct. 17, 2012. The disclosures in the above-referenced patent applications are hereby incorporated fully by reference into the present application.

The present application claims the benefit of and priority to a provisional patent application entitled "Power Module and Package Therefor," Serial Number 61/715,129filed on Oct. 17, 2012. The disclosure in this provisional application is hereby incorporated fully by reference into the present application.

BACKGROUND

An electronic circuit, such as power circuits, can be formed from dies interconnected on a substrate. Although the dies may be capable of high performance, performance of the electronic circuit can be limited by how the dies are interconnected. For example, inductivity, electromagnetic interference (EMI), and parasitics are of great concern when interconnecting the dies.

One approach to interconnecting dies to form an electronic circuit includes wire bonding the dies to conductive traces on a substrate. The design and layout of the electronic circuit can be complex as the electronic circuit may include many dies. As such, the conductive traces may follow long routing paths having high inductivity. Thus, performance of the electronic circuit can suffer. Furthermore, the electronic circuit may have a large footprint, which may be undesirable in many applications.

SUMMARY

Surface mountable power components, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
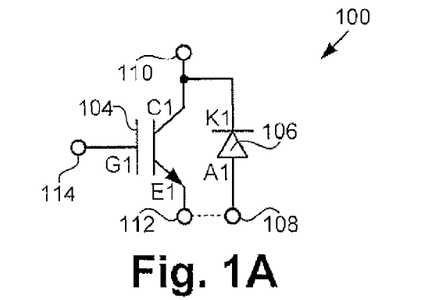
FIG. 1A presents a schematic of an exemplary circuit of a power component, in accordance with an implementation of the present disclosure.

FIG. 1A presents a schematic of an exemplary circuit of a power component, in accordance with an implementation of the present disclosure. In FIG. 1A, circuit 100 includes transistor 104 and diode 106. Transistor 104 and diode 106 are each semiconductor devices, and more particularly power semiconductor devices. Transistor 104 is an insulated-gate bipolar transistor (IGBT) that includes collector C1, emitter E1, and gate G1. However, transistor 104 need not be an IGBT and while the present application refers to a collector and emitter, those terms should be considered replaceable with a source and a drain respectively. Diode 106 includes cathode K1 and anode A1.

As shown in FIG. 1A circuit 100 also includes terminals 108, 110, 112, and 114. Terminal 114 is coupled to gate G1 of transistor 104. Terminal 110 is coupled to collector C1 of transistor 104 and cathode K1 of diode 106. Terminal 112 is coupled to emitter E1 of transistor 104. Terminal 108 is coupled to anode A1 of diode 106. In some implementations, emitter E1 of transistor 104 and anode A1 of diode 106 are instead coupled to a shared terminal in circuit 100.

Circuit 100 can be utilized to from an electronic circuit, such as a power circuit. Transistor 104 can be a power transistor of the power circuit and diode 106 can be a freewheeling diode (e.g. a Schottky diode) of the power circuit. For example, in the present implementation, circuit 100 can be utilized to form a high-side of a power switching circuit. A dashed line in FIG. 1A indicates that terminal 112 can be coupled to terminal 108 in the power switching circuit so as to couple emitter E1 of transistor 104 to Anode A1 of diode 106. In other implementations, emitter E1 of transistor 104 is coupled to Anode A1 of diode 106 within circuit 100.

As described above, transistor 104 need not be an IGBT. Other examples of transistor 104 include a metal-Oxide-semiconductor field-effect transistor (MOSFET) and a high-electron-mobility transistor (HEMT). Transistor 104 and diode 106 comprise semiconductor devices and either can be, for example, a silicon or group III-V semiconductor device (e.g. a III-Nitride device). In one implementation, transistor 104 is a GaN HEMT. Where transistor 104 is a MOSFET, diode 106 may be a body diode of the MOSFET. In other implementations, either of transistor 104 or diode 106 are not included in circuit 100.

In the present implementation, transistor 104 and diode 106 are provided on respective dies. An electronic circuit can be formed from the respective dies interconnected on a substrate. Although the respective dies may be capable of high performance, performance can be limited by how the respective dies are interconnected in the electronic circuit. For example, inductivity, EMI, and parasitics are of great concern when interconnecting the dies.

In accordance with an implementation of the present disclosure, one or more dies are provided in an electrical component (e.g. a power component). One or more of the electrical components can be surface mounted to a substrate (e.g. a circuit substrate) so as to form an electronic circuit (e.g. a power circuit). The one or more of the electrical components allow for the electronic circuit to be formed without significantly limiting performance of the one or more dies. As such, the electronic circuit can exhibit low inductivity, EMI, and parasitics. Furthermore, the electronic circuit may be configured to have a small footprint.

Figure 1B:
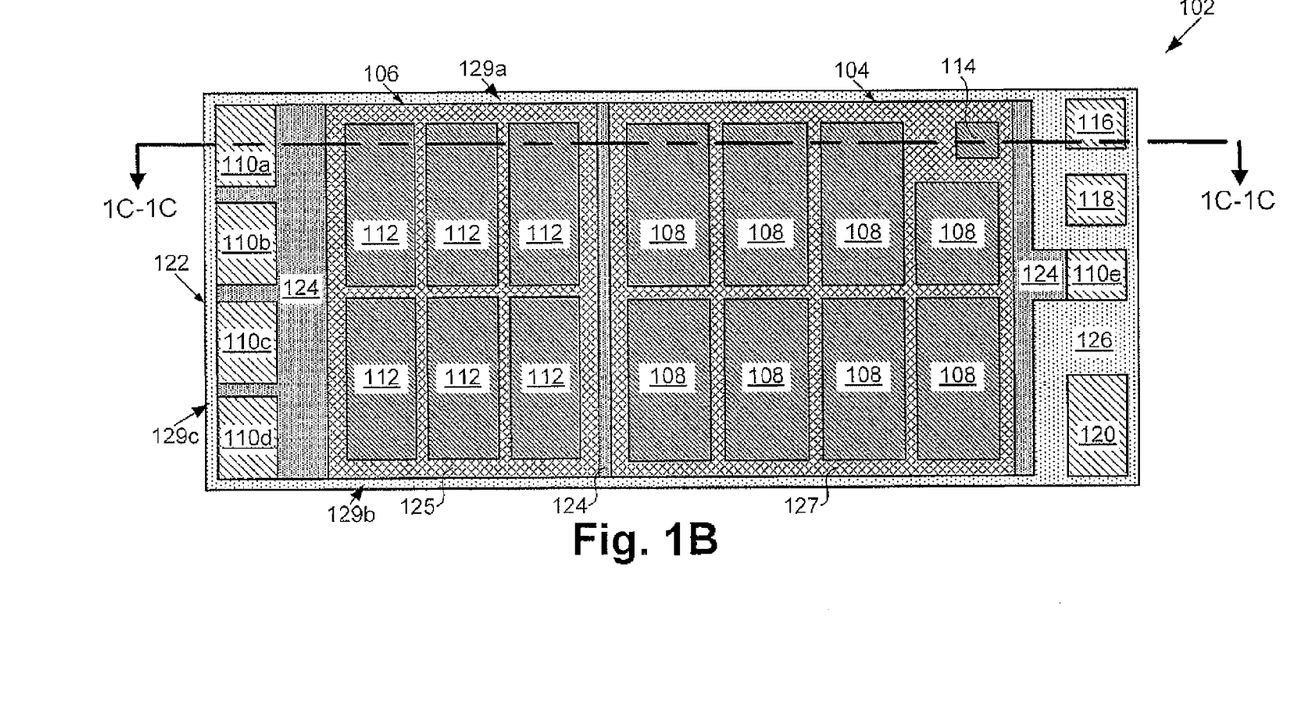
FIG. 1B presents a top view of an exemplary power component, in accordance with an implementation of the present disclosure.
Figure 1C:
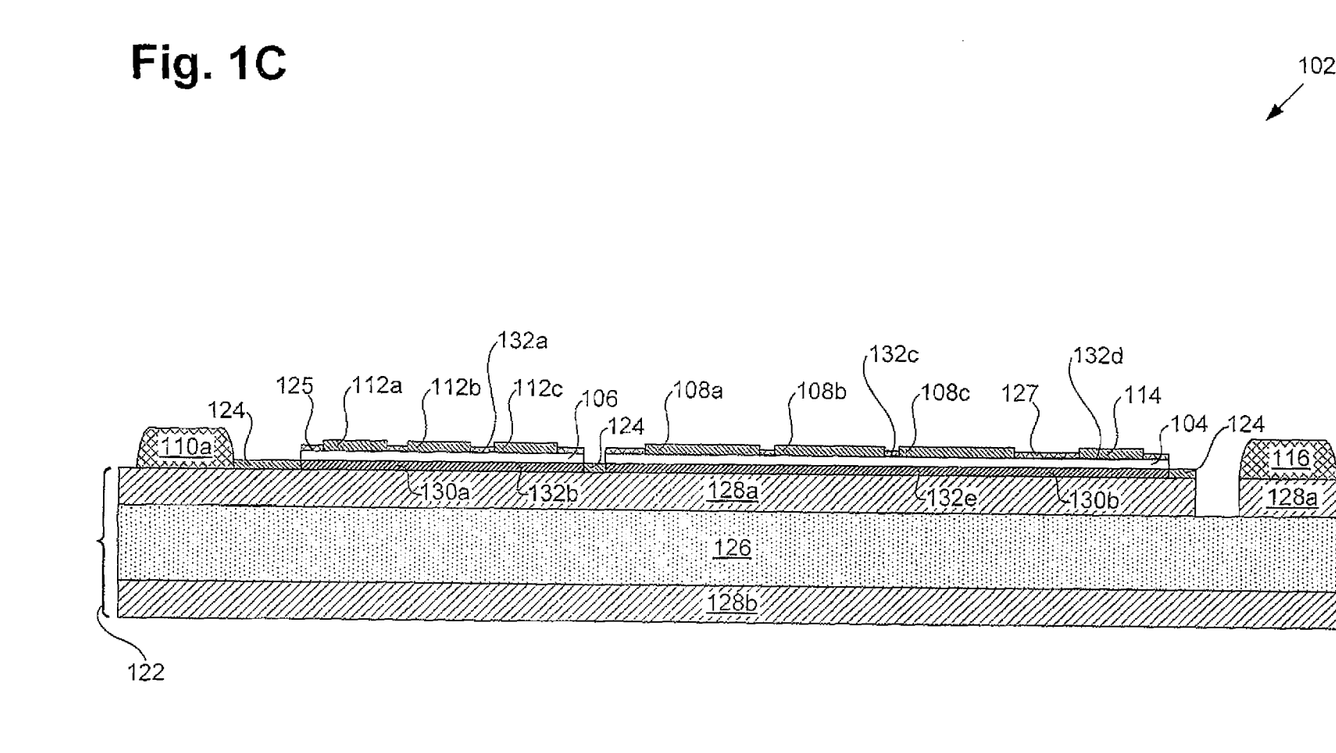
FIG. 1C presents a cross-sectional view of an exemplary power component, in accordance with an implementation of the present disclosure.

Referring now to FIGS. 1B and 1C, FIG. 1B presents a top view of an exemplary power component, in accordance with an implementation of the present disclosure. FIG. 1C presents a cross-sectional view of the exemplary power component of FIG. 1B, in accordance with an implementation of the present disclosure. The cross-sectional view in FIG. 1C corresponds to cross-section 1C-1C in FIG. 1B. Power component 102 in FIGS. 1B and 1C implements circuit 100 of FIG. 1A.

In power component 102, transistor 104 and diode 106 are on respective dies. As shown in FIG. 1C, diode 106 includes surface electrodes 132a and 132b on opposing side thereof. Surface electrode 132a corresponds to anode A1 in FIG. 1A and surface electrode 132b corresponds to cathode K1 in FIG. 1A. Also shown in FIG. 1C, transistor 104 includes surface electrodes 132c and surface electrode 132d on one side, and 132d on an opposing side thereof. Surface electrode 132c corresponds to emitter E1 in FIG. 1A, surface electrode 132d corresponds to gate G1 in FIG. 1A, and surface electrode 132e corresponds to collector C1 in FIG. 1A.

Surface electrode 132a of diode 106 is optionally coated with solder through openings in passivation 125 thereby forming terminal 112 of power component 102. Similarly, surface electrodes 132c and 132d of transistor 104 are optionally coated with solder through openings in passivation 127 thereby forming terminals 108 and 114 respectively of power component 102. The solder can form solder bumps on surface electrodes 132a, 132c, and 132d. The solder can include, for example, Sn—Ag—Cu (SAC). As one specific example, the solder bumps can be approximately 120 micrometers thick. However, in some implementations, any of surface electrodes 132a, 132c, and 132d include one or more sintered bumps or a metal containing layer that allows for sintering. As an example, surface electrodes 132a, 132c, and 132d may be finished with a noble metal such as silver, gold or palladium. In other implementations, any of surface electrodes 132a, 132c, and 132d can be left exposed.

Transistor 104 and diode 106 are each electrically and mechanically coupled to component substrate 122. In the present implementation, component substrate 122 includes dielectric layer 126 situated between conductive layers 128a and 128b. As a specific example, dielectric layer 126 can be approximately 380 micrometers thick. Conductive layers 128a and 128b can each be approximately 200 micrometers thick. Conductive layer 128a is patterned, such that portions of dielectric layer 126 are revealed, as shown in FIG. 1B.

Dielectric layer 126 can include one or more dielectric materials, such as dielectric ceramic material. Examples of dielectric layer 126 include alumina, silicon nitride, and aluminum nitride. Conductive layers 128a and 128b can each include one or more conductive materials, such as metal and/or metal alloy. In the present implementation, component substrate 122 is a direct bonded copper (DBC) substrate. Conductive layers 128a and 128b are copper layers bonded on opposing surfaces of dielectric layer 126, which includes 96% alumina. However, component substrate 122 can be other types of substrates, as examples, an insulated metal substrate or aluminum nitride (AlN) substrate. Component substrate 122 can vary structurally from what is shown and can include different materials and/or layers, which may include vias and/or other structures.

In the present implementation, transistor 104 has surface electrode 132e (e.g. a collector electrode) electrically and mechanically coupled to component substrate 122 using die attach 130h. Also, diode 106 has surface electrode 132b (e.g. a cathode electrode) electrically and mechanically coupled to component substrate 122 using die attach 130a. Collector C1 of transistor 104 and cathode K1 of diode 106 are thereby electrically coupled together through conductive layer 128a of component substrate 122.

In the present implementation, die attach 130a and die attach 130b include conductive die attach material, but may not be conductive in some implementations. Die attach 130a and die attach 130h can include solder, such as high lead solder. The high lead solder can be approximately 100 micrometers thick as one specific example. In some implementations, the die attach material is a sintered die attach material. Utilizing sintered die attach material may, in some instances, increase the reliability of the die attach interfaces for transistor 104 and diode 106. Furthermore, utilizing sintered die attach material enables power component 102 to be lead free, while maintaining high performance.

Peripheral contacts 110a, 110b, 110c, 110d, 110e, 116, 118, and 120 are situated on component substrate 122. Transistor 104 and diode 106 are situated between peripheral contacts 110a, 110b, 110c, and 110d and peripheral contacts 110e, 116, 118, and 120. Various ones of peripheral contacts 110a, 110b, 110c, 110d, 110e, 116, 118, and 120 are optional. For example, more generally stated, transistor 104 and diode 106 are situated between at least one first peripheral contact and at least one second peripheral contact. Peripheral contacts 110a, 110b, 110c, 110d, 110e, 116, 118, and 120 are configured for surface mounting, as are surface electrodes 132a of diode 106 and surface electrodes 132c and 132d of transistor 104.

In accordance with various implementations of the present disclosure, any combination of peripheral contacts can be electrically coupled to a semiconductor device of an electrical component, or can be electrically floating (i.e. an electrically floating contact). In the present implementation, peripheral contacts 110a, 110b, 110c, 110d, 110e, 116, 118, and 120 each are bump contacts on conductive layer 128a of component substrate 122. Peripheral contacts 110a, 110b, 110c, 110d, 110e, 116, 118, and 120 can include solder material, such as SAC. Peripheral contacts 110a, 110b, 110c, 110d, 110e, 116, 118, and 120 may instead include a conductive adhesive, such as a sinter material or electrically conductive metal containing adhesive, such as a silver filled epoxy (i.e. a conductive epoxy). The bump contacts can be formed from the solder material, the sinter material, or the conductive adhesive.

Peripheral contacts 110a, 110b, 110c, 110d, 110e, 116, 118, and 120 are formed in openings in mask layer 124, which is situated on conductive layer 128a. Mask layer 124 can comprise solder mask material deposited on component substrate 122 utilizing screen printing. Mask layer 124 can be approximately 20 micrometers to approximately 25 micrometers thick and is used to define peripheral contacts 110a, 110b, 110c, 110d, 110e, 116, 118, and 120 as well as bond pads for transistor 104 and diode 106.

Mask layer 124 defines bond pads for transistor 104 and diode 106 without adjoining transistor 104 or diode 106 on sides 129a and 129b of power component 102. This allows for power component 102 to have a smaller footprint, A strip of mask layer 124 separates transistor 104 and diode 106. Similarly, mask layer 124 defines peripheral contacts 110a, 110b, 110c, and 110d without adjoining peripheral contacts 110a, 110b, 110c, and 110d on side 129c of power component 102.

Mask layer 124 is optional and in particular may not be included in power component 102 where sinter material is utilized for peripheral contacts 110a, 110b, 110c, 110d, and 110e, die attach 130a, and die attach 130b.

Peripheral contacts 110a, 110b, 110c, 110d, and 110e are electrically coupled to surface electrodes 132b and 132e through conductive layer 128a of component substrate 122. Peripheral contacts 110a, 110b, 110c, 110d, and 110e correspond to terminal 110 in FIG. 1A. In contrast, Peripheral contacts 116, 118, and 120 are electrically floating. As shown in FIG. 1B, conductive layer 128a is patterned, such that peripheral contacts 116, 118, and 120 are surrounded by dielectric layer 126. Peripheral contacts 116, 118, and 120 can contribute to surface mounting stability of power component 102. Furthermore, peripheral contacts 116, 118, and 120 can aid in forming electrical connections between power component 102 and a circuit substrate, as will be described in additional detail with respect to FIG. 3B.

Peripheral contacts 110a, 110b, 110c, and 110d extend along substantially a full length of transistor 104 and diode 106 so as to provide high surface mounting stability. Similarly, peripheral contacts 116, 118, 110e, and 120 extend along substantially a full length of transistor 104 and diode 106 so as to provide high surface mounting stability that protects from tilt. More or fewer peripheral contacts may be utilized than what is shown. Peripheral contacts 110a, 110b, 110c, 110d, 110e, 116, 118, and 120 are approximately 220 micrometers thick, as one specific example.

Peripheral contacts 110a, 110b, 110c, 110d, 110e, 116, 118, and 120 can be substantially coplanar. Also, terminals 112, 108, and 114 can be substantially coplanar. As shown in FIG. 1C, terminals 112, 108, and 114 (e.g. solder bumps or bump contacts) are optionally lower or thinner than peripheral contacts 110a, 110b, 110c, 110d, 110e, 116, 118, and 120, as shown in FIG. 1C. For example, terminals 112, 108, and 114 can be approximately 0.50 micrometers lower than peripheral contacts 110a, 110b, 110c, 110d, 110e, 116, 118, and 120. As a more specific example, the total stack on component substrate 122, which includes transistor 104 and diode 106, can be approximately 290 micrometers thick, while peripheral contacts 110a, 110b, 110c, 110d, 110e, 116, 118, and 120 are approximately 340 micrometers thick. This standoff can reduce mechanical damage to the active areas of transistor 104 and diode 106 during component placement onto a circuit substrate.

Figure 2A:
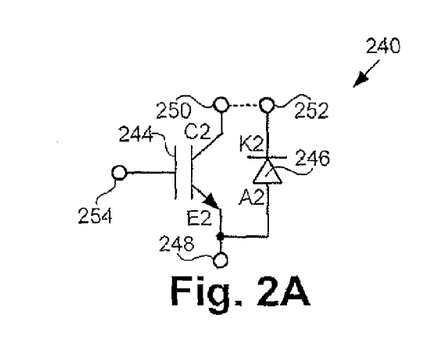
FIG. 2A presents a schematic of an exemplary circuit of a power component, in accordance with an implementation of the present disclosure.
Figure 2B:
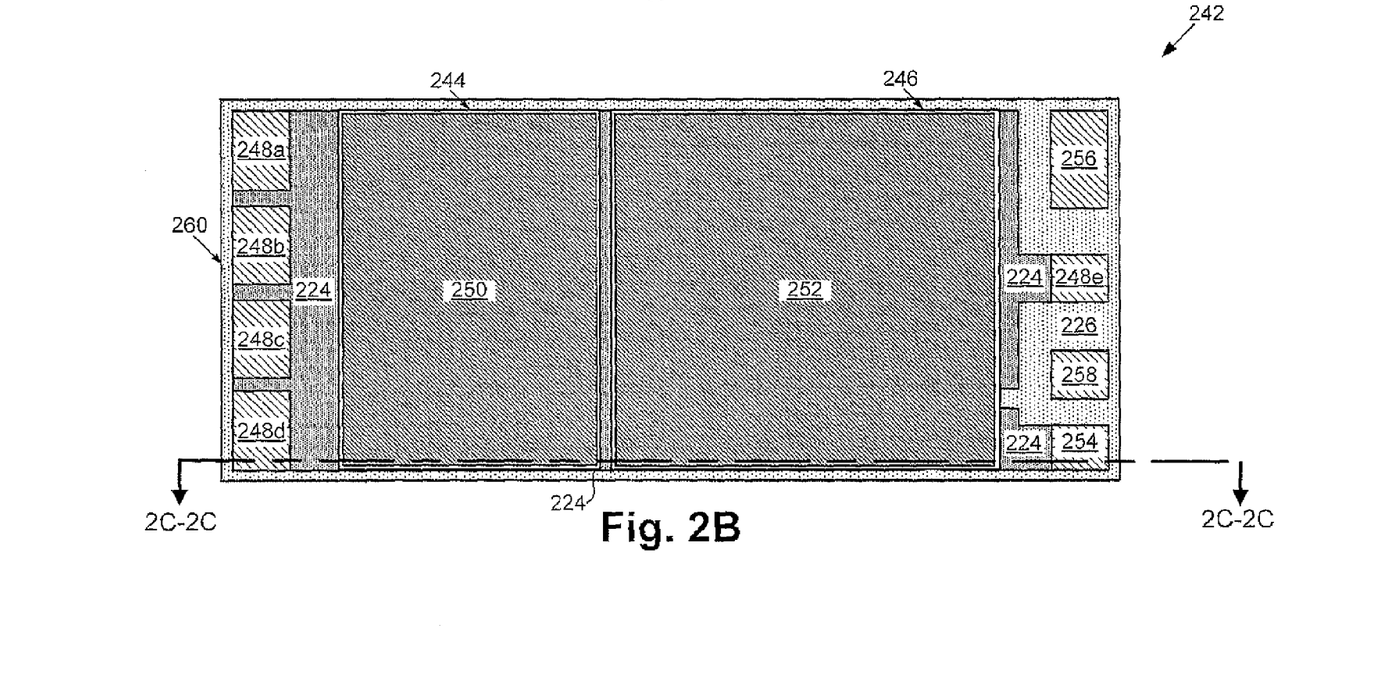
FIG. 2B presents a top view of an exemplary power component, in accordance with an implementation of the present disclosure.
Figure 2C:
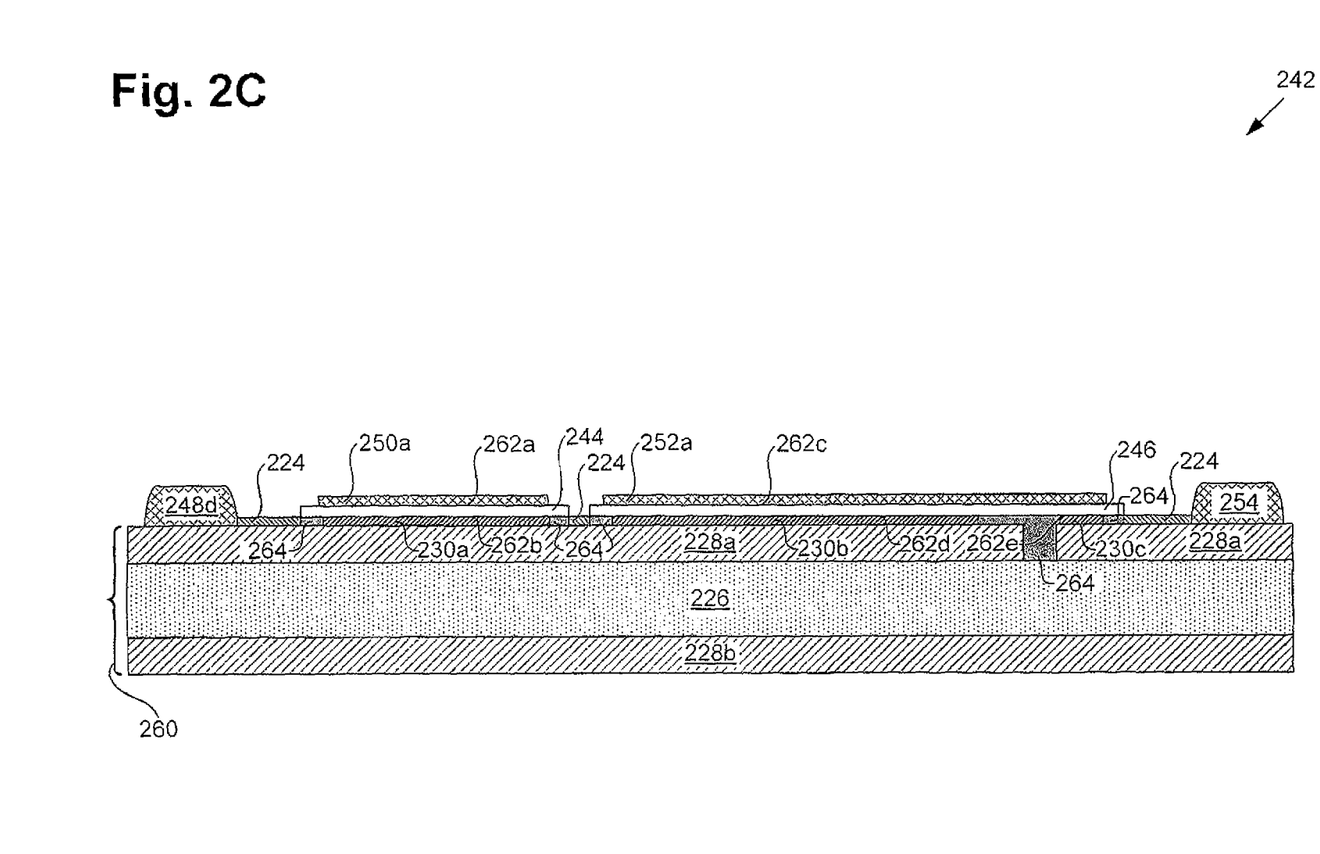
FIG. 2C presents a cross-sectional view of an exemplary power component, in accordance with an implementation of the present disclosure.

Each die in power component 102 in FIGS. 1B and 1C includes only one surface electrode electrically and mechanically coupled to component substrate 122. However, either die may include multiple surface electrodes electrically and mechanically coupled to component substrate 122. FIGS. 2A, 2B, and 2C illustrate one such example, which may be desirable for implementing a half-bridge of a power switching circuit when utilized with power component 102.

Referring now to FIG. 2A, FIG. 2A presents a schematic of an exemplary circuit of a power component, in accordance with an implementation of the present disclosure. In FIG. 2A, circuit 240 includes transistor 244 and diode 246. Transistor 244 and diode 246 can correspond respectively to transistor 104 and diode 106 in FIG. 1A, and thus are not described in detail. Transistor 244 includes collector C2, emitter E2, and gate G2. Diode 246 includes cathode K2 and anode A2.

As shown in FIG. 2A circuit 240 also includes terminals 248, 250, 252, and 254. Terminal 254 is coupled to gate G2 of transistor 244. Terminal 248 is coupled to emitter E2 of transistor 244 and cathode K2 of diode 246. Terminal 250 is coupled to collector C2 of transistor 244. Terminal 252 is coupled to cathode K2 of diode 246. In some implementations, collector C2 of transistor 244 and cathode K2 of diode 246 are instead coupled to a shared terminal in circuit 240.

Circuit 240 can be utilized to from an electronic circuit, such as the power circuit described above with respect to circuit 100 of FIG. 1A. Transistor 244 can be a power transistor of the power circuit and diode 246 can be a freewheeling diode (e.g. a Schottky diode) of the power circuit. For example, in the present implementation, circuit 240 is utilized to form a low-side of a power switching circuit. A dashed line in FIG. 2A indicates that terminal 250 can be coupled to terminal 252 in the power switching circuit so as to couple collector C2 of transistor 244 to cathode K2 of diode 246. In other implementations, collector C2 of transistor 244 is coupled to cathode K2 of diode 246 within circuit 240.

Referring now to FIGS. 2B and 2C, FIG. 2B presents a top view of an exemplary power component, in accordance with an implementation of the present disclosure. FIG. 2C presents a cross-sectional view of the exemplary power component of FIG. 2B, in accordance with an implementation of the present disclosure. The cross-sectional view in FIG. 2C corresponds to cross-section 2C-2C in FIG. 2B. Power component 242 in FIGS. 2B and 2C implements circuit 240 of FIG. 2A.

In power component 242, transistor 244 and diode 246 are on respective dies. The dies can correspond to the dies of transistor 104 and diode 106 respectively of FIGS. 1B and 1C, but are flipped and attached to component substrate 260. As shown in FIG. 2C, diode 246 includes surface electrodes 262a and 262b on opposing side thereof. Surface electrode 262a corresponds to cathode K2 in FIG. 2A and surface electrode 262b corresponds to anode A2 in FIG. 2A. Also shown in FIG. 2C, transistor 244 includes surface electrodes 262c and 262d on one side, and surface electrode 262d on an opposing side thereof. Surface electrode 262c corresponds to collector C2 in FIG. 2A, surface electrode 262d corresponds to emitter E2 in FIG. 2A, and surface electrode 262e corresponds to gate G2 in FIG. 2A.

Surface electrode 262a of diode 246 is optionally coated with solder thereby forming terminal 252 of power component 242. Similarly, surface electrode 262c is optionally coated with solder thereby forming terminal 250 power component 242. The solder can include, for example, Sn—Ag—Cu (SAC) and as one specific example, can be approximately 120 micrometers thick. However, in some implementations, any of surface electrodes 262a and 262c include sinter material or a metal containing layer that allows for sintering. As an example, surface electrodes 262a and 262c may be finished with a noble metal such as silver, gold or palladium. In other implementations, any of surface electrodes 262a and 262c can be left exposed.

Transistor 244 and diode 246 are each electrically and mechanically coupled to component substrate 260. In the present implementation, component substrate 260 includes dielectric layer 226 situated between conductive layers 228a and 228b. Component substrate 260 is similar to component substrate 122 in FIGS. 1B and 1C and therefore, exemplary materials and structure are not repeated.

In the present implementation, transistor 244 has surface electrode 262d (e.g. an emitter electrode) and surface electrode 262e (e.g. a gate electrode) electrically and mechanically coupled to component substrate 260 using respective die attach 230b and 230c. Also, diode 246 has surface electrode 262b (e.g. an anode electrode) electrically and mechanically coupled to component substrate 260 using die attach 230a. Emitter E2 of transistor 244 and anode A2 of diode 246 are thereby electrically coupled together through conductive layer 228a of component substrate 260. However, gate G2 of transistor 244 is electrically isolated from emitter E2 and anode A2 by patterning conductive layer 228a. Die attach 230a, die attach 230b, and 230c are similar to die attach 130a and die attach 130b in FIG. 1C and are therefore not described in detail.

Peripheral contacts 248a, 248b, 248c, 248d, 248e, 254, 256, and 258 are situated on component substrate 122. Transistor 244 and diode 246 are situated between peripheral contacts 248a, 248b, 248c, and 248d and peripheral contacts 248e, 254, 256, and 258. Various ones of peripheral contacts 248a, 248b, 248c, 248d, 248e, 254, 256, and 258 are optional. For example, more generally stated, transistor 244 and diode 246 are situated between at least one first peripheral contact and at least one second peripheral contact. Peripheral contacts 248a, 248b, 248c, 248d, 248e, 254, 256, and 258 are configured for surface mounting, as are surface electrodes 262a of diode 246 and surface electrode 262c of transistor 244.

Similar to power component 102 of FIGS. 1B and 1C, any combination of peripheral contacts can be electrically coupled to a semiconductor device of an electrical component, or can be electrically floating. In the present implementation, peripheral contacts 248a, 248b, 248c, 248d, 248e, 254, 256, and 258 each are bump contacts on conductive layer 228a of component substrate 260. Peripheral contacts 248a, 248b, 248c, 248d, 248e, 254, 256, and 258 are similar to the peripheral contacts described above with respect to power component 102 and therefore are not described in detail. Peripheral contacts 248a, 248b, 248c, 248d, 248e, 254, 256, and 258 are formed in openings in mask layer 224. Mask layer 224 is similar to mask layer 124 and therefore is not described in detail.

Peripheral contacts 248a, 248b, 248c, 248d, and 248e are electrically coupled to surface electrodes 262b and 262d through conductive layer 228a of component substrate 122. Peripheral contacts 248a, 248b, 248c, 248d, and 248e correspond to terminal 248 in FIG. 2A. Peripheral contact 254 is also electrically coupled to surface electrode 262e through conductive layer 228a, but is electrically isolated from surface electrodes 262b and 262d.

Power component 242 optionally includes underfill material 264 between transistor 244 and diode 246 and component substrate 260. Underfill material 264 can provide mechanical support transistor 244 and diode 246 in regions that do not include die attach. Furthermore, underfill material 264 can enhance electrical insulation between the portion of conductive layer 228a electrically coupled to gate G2 and the portion of conductive layer 228a electrically coupled to emitter E2. This can prevent arcing in implementations where a voltage at gate G2 is substantially lower than a voltage at emitter E2. As an alternative, the patterning of conductive layer 228a may be have sufficient separation without requiring underfill material 264.

In contrast to peripheral contacts 248a, 248b, 248c, 248d, 248e, and 254, peripheral contacts 256 and 258 are electrically floating. As shown in FIG. 2B, conductive layer 228a is patterned, such that peripheral contacts 256 and 258 are surrounded by dielectric layer 226. Peripheral contacts 256 and 258 can contribute to surface mounting stability of power component 242. Furthermore, peripheral contacts 256 and 258 can aid in forming electrical connections between power component 242 and a circuit substrate, as will be described in additional detail with respect to FIG. 3B. Similar to power component 102, a standoff can be provided to reduce mechanical damage to the active areas of transistor 244 and diode 246 during component placement onto the circuit substrate.

Figure 3A:
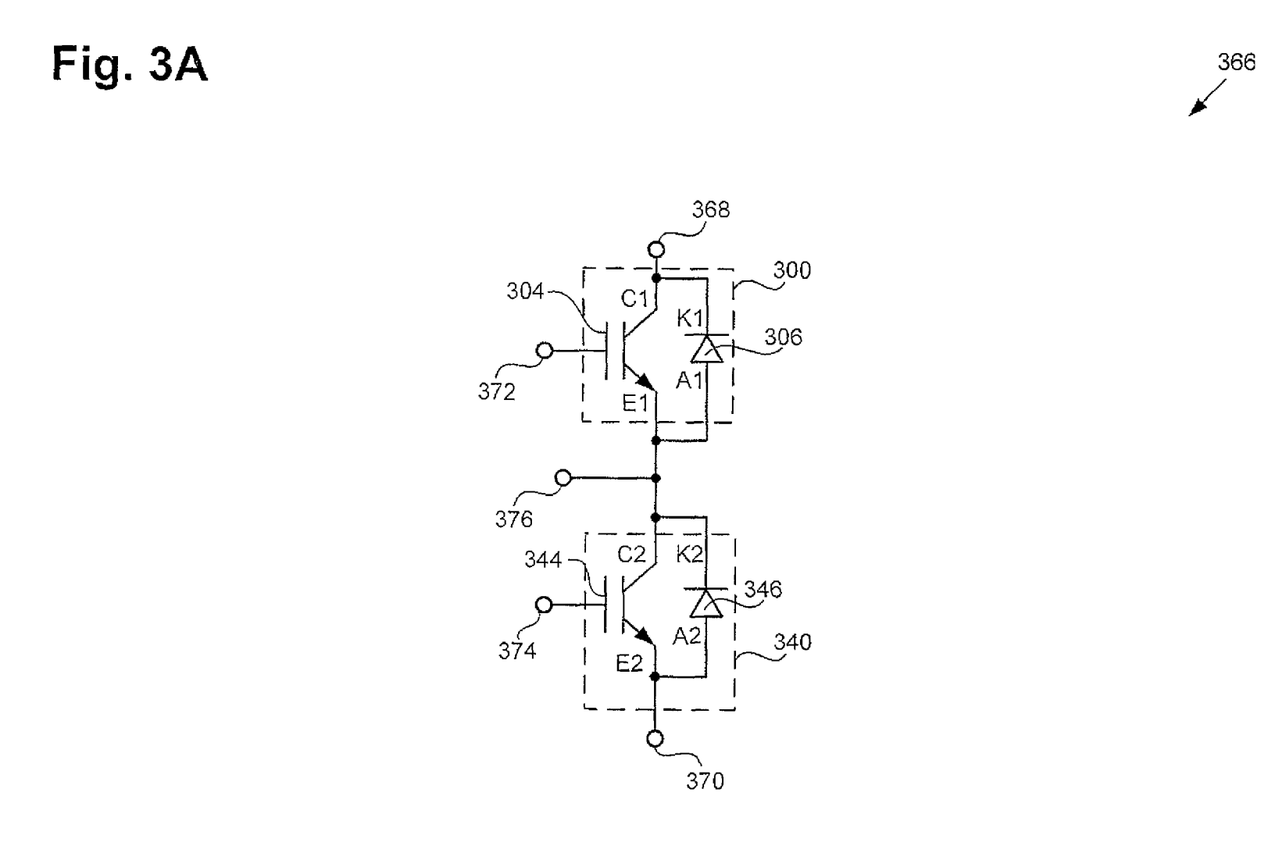
FIG. 3A presents a schematic of an exemplary power circuit formed on a circuit substrate, in accordance with an implementation of the present disclosure.
Figure 3B:
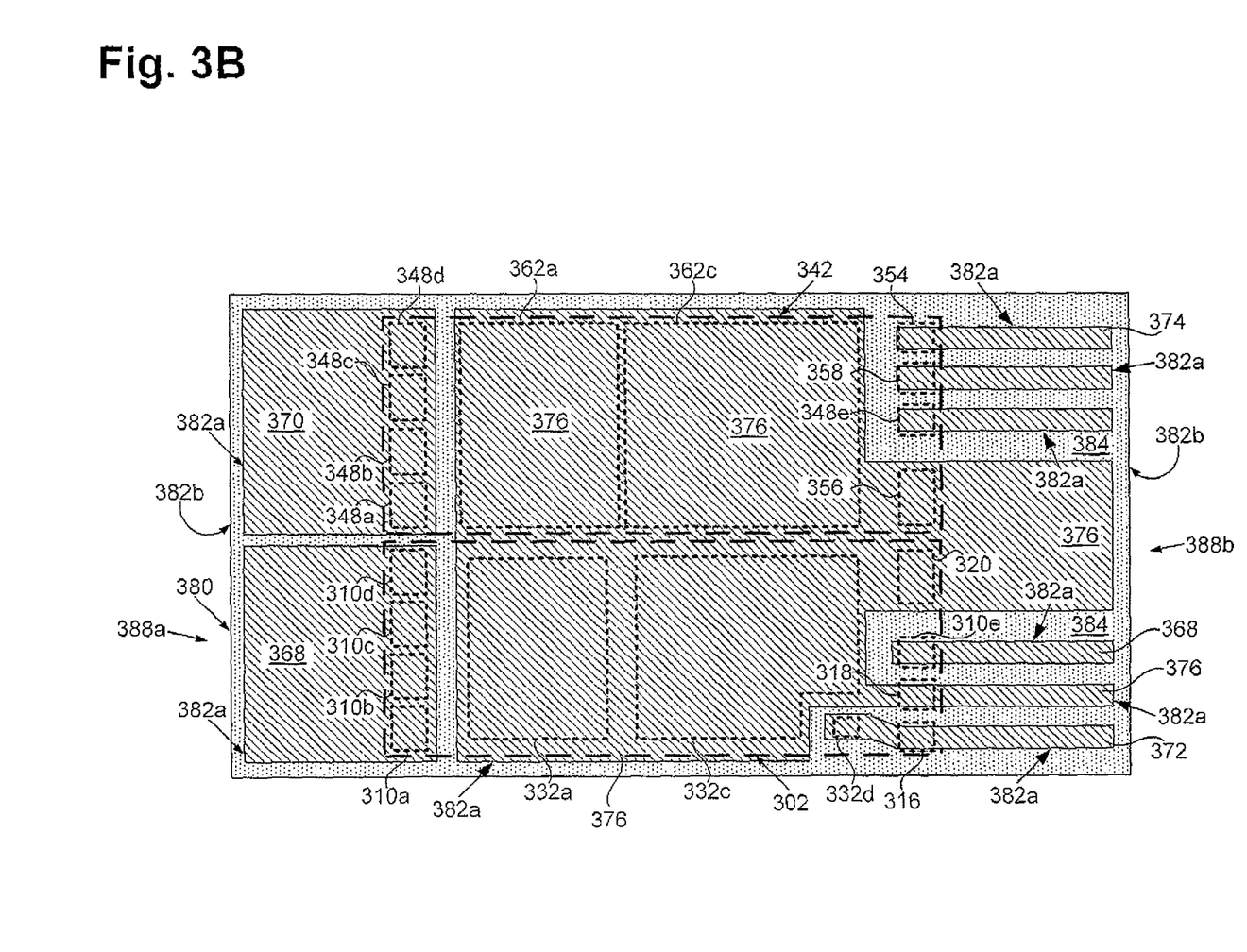
FIG. 3B presents a top view of exemplary power components on a circuit substrate, in accordance with an implementation of the present disclosure.

FIGS. 3A, 3B, and 3C show one way in which power components 102 and 242 can be surface mounted to a substrate (e.g. a circuit substrate) so as to form an electronic circuit (e.g. a power circuit).

Referring now to FIG. 3A, FIG. 3A presents a schematic of an exemplary power circuit formed on a circuit substrate, in accordance with an implementation of the present disclosure. In FIG. 3A, power circuit 366 includes circuits 300 and 340 corresponding respectively to circuit 100 in FIG. 1A and circuit 240 in FIG. 2A.

As shown in FIG. 3A circuit 366 also includes terminals 368, 370, 372, 374, and 376. Terminal 368 is coupled to cathode K1 of diode 306 corresponding to diode 106 in FIGS. 1A through 1C and to collector C1 of transistor 304 corresponding to transistor 104 in FIGS. 1A through 1C. Terminal 370 is coupled to anode A2 of diode 346 corresponding to diode 246 in FIGS. 2A through 2C and to emitter E2 of transistor 344 corresponding to transistor 244 in FIGS. 2A through 2C. Terminal 372 is coupled to gate G1 of transistor 304 and terminal 374 is coupled to gate G2 of transistor 344. Also in circuit 366, terminal 376 is coupled to emitter E1 of transistor 304, anode A1 of diode 306, collector C2 of transistor 344, and cathode K2 of diode 346.

Circuit 366 is a half-bridge that can be utilized in a power switching circuit. For example, in the present implementation, circuit 300 can form a high-side of the power switching circuit and circuit 340 can form a low-side of the power switching circuit. Circuit 366 is merely exemplary and electrical components can be utilized to form various electrical circuits in accordance with various implementations of the present disclosure.

Referring now to FIG. 3B, FIG. 3B presents a top view of exemplary power components on a circuit substrate, in accordance with an implementation of the present disclosure. FIG. 3B shows power components 302 and 342 corresponding respectively to power component 102 is FIGS. 1B and 1C and power component 242 in FIGS. 2B and 2C.

Power components 302 and 342 are indicated by dashed lines with various peripheral contacts and surface electrodes being indicated by smaller dashed lines. As shown, power component 342 includes surface electrodes 362a and 362c corresponding respectively to surface electrodes 262a and 262c of power component 242. Power component 342 also includes peripheral contacts 348a, 348b, 348c, 348d, 348e, 354, 356, and 358 corresponding respectively to peripheral contacts 248a, 248b, 248c, 248d, 248e, 254, 256, and 258 of power component 242. Power component 302 includes surface electrodes 332a, 332c, and 332d corresponding respectively to surface electrodes 232a, 232c, and 232d of power component 102. Power component 302 also includes peripheral contacts 310a, 310b, 310c, 310d, 310e, 316, 318, and 320 corresponding respectively to peripheral contacts 110a, 110b, 110c, 110d, 110e, 116, 118, and 120 of power component 102.

FIG. 3B also shows circuit substrate 380. Circuit substrate 380 can be similar to component substrate 122 in FIGS. 1B and 1C and component substrate 260 in FIGS. 2B and 2C and can include similar materials and structure. For example, in the present implementation, circuit substrate 380 is a DBC substrate. Thus, circuit substrate 380 includes conductive layers 382a and 382b and dielectric layer 384 corresponding respectively to conductive layers 128a and 128b and dielectric layer 126 in FIG. 1C.

Power components 302 and 342 are surface mounted to circuit substrate 380. More particularly, each of the peripheral contacts and surface electrodes shown in FIG. 3B are electrically and mechanically coupled to circuit substrate 380 thereby forming the terminals of circuit 366 as shown. This can be accomplished using a lead free solder such as SAC, conductive adhesive, or sinter material. As shown in FIG. 3B, optionally, terminals of circuit 366 are provided at narrow sides 388a and/or 388b of circuit substrate 380 thereby allowing for a narrow form factor and small footprint.

Peripheral contacts 320 and 356 can be referred to respectively as emitter and collector bridging contacts. Peripheral contacts 320 and 356 are optionally larger than other peripheral contacts on power components 302 and 342 so as to provide enhanced current conduction through terminal 376 of circuit 366. Furthermore, peripheral contacts 320 and 356 are located at respective edges of power components 302 and 342 allowing for wide conductive tracking out from under power components 302 and 342. This can reduce parasitic resistance and inductance of terminal 376 and as well as joule heating during high current loads. Also, peripheral contacts 320 and 356 are spaced farther from other peripheral contacts so as to avoid interference due to potentially large switching voltages that may be on terminal 376.

Peripheral contacts 318 and 358 can optionally be utilized as emitter contacts for current sensing. For example, peripheral contact 318 is configured for current sensing as shown. Alternatively, peripheral contacts 318 and 358 can be left electrically floating while providing structural stability to power components 302 and 342.

Thus, as shown, power components 302 and 342 can be surface mounted on circuit substrate 380 so as to provide a power circuit, such as a half-bridge. Multiple ones of the power circuits may be connected in parallel so as to form two-phase inverters, three-phase inverters, or other power switching circuits. Additionally, more or fewer of any of power components may be surface mounted to the same circuit substrate than what is shown. For example, circuit substrate 380 can include a two-phase inverter having four power components surface mounted thereon or a three-phase inverter having six power components surface mounted thereon.

Thus, as described with respect to FIGS. 1A, 1B, 1C, 2A, 2B, 2C, 3A, and 3B, in accordance with exemplary implementations of the present disclosure, one or more dies are provided in an electrical component (e.g. a power component). One or more of the electrical components can be surface mounted to a substrate (e.g. a circuit substrate) so as to form an electronic circuit (e.g. a power circuit). The one or more of the electrical components allow for the electronic circuit to be formed without significantly limiting performance of the one or more dies. As such, the electronic circuit can exhibit low inductivity, EMI, and parasitics. Furthermore, the electronic circuit may be configured to have a small footprint.

Power components and circuits are emphasized herein as aspects of the present disclosure are particularly advantageous for those applications. However, it is noted that the present application relates generally to electrical components having one or more electrical devices, such as diodes, MOSFETs, or IGBTs.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power component comprising:
a component substrate;
a power semiconductor device separate from, situated over, and coupled to said component substrate;
a diode coupled to said power semiconductor device through said component substrate;
at least one first peripheral contact and at least one second peripheral contact situated directly on said component substrate, said power semiconductor device situated between said at least one first peripheral contact and said at least one second peripheral contact;
said at least one first peripheral contact and said at least one second peripheral contact being configured for surface mounting.

2. The power component of claim 1, wherein said at least one first peripheral contact is electrically coupled to said power semiconductor device.

3. The power component of claim 1, wherein said at least one second peripheral contact is electrically coupled to said power semiconductor device.

4. The power component of claim 1, wherein said at least one first peripheral contact is electrically floating.

5. The power component of claim 1, wherein said at least one second peripheral contact is electrically floating.

6. The power component of claim 1, wherein said component substrate comprises a dielectric layer situated between conductive layers.

7. The power component of claim 1, wherein said power semiconductor device is coupled to a conductive layer of said component substrate.

8. A power component comprising:
a component substrate;
a power transistor separate from, situated over, and having a collector electrode coupled to said component substrate;
a diode coupled to said power transistor through said component substrate;
at least one first peripheral contact and at least one second peripheral contact situated directly on said component substrate, said power transistor situated between said at least one first peripheral contact and said at least one second peripheral contact;
said at least one first peripheral contact coupled to said collector electrode through said component substrate;
said at least one first peripheral contact and said at least one second peripheral contact being configured for surface mounting.

9. The power component of claim 8, wherein said at least one first peripheral contact is electrically coupled to said power transistor.

10. The power component of claim 8, wherein said at least one second peripheral contact is electrically coupled to said power transistor.

11. The power component of claim 8, wherein said at least one first peripheral contact is electrically floating.

12. The power component of claim 8, wherein said at least one second peripheral contact is electrically floating.

13. The power component of claim 8, wherein said component substrate comprises a dielectric layer situated between conductive layers.

14. The power component of claim 8, wherein said power transistor is coupled to a conductive layer of said component substrate.

15. A power component comprising:
- a component substrate;
- a power transistor separate from, situated over, and having an emitter electrode coupled to said component substrate;
- at least one first peripheral contact and at least one second peripheral contact situated directly on said component substrate, said power transistor situated between said at least one first peripheral contact and said at least one second peripheral contact;
- a diode coupled to said power transistor through said component substrate;
- said at least one first peripheral contact electrically coupled to said emitter electrode through said component substrate;
- said at least one first peripheral contact and said at least one second peripheral contact being configured for surface mounting.

16. The power component of claim 15, wherein said at least one first peripheral contact is electrically coupled to said power transistor.

17. The power component of claim 15, wherein said at least one second peripheral contact is electrically coupled to said power transistor.

18. The power component of claim 15, wherein said at least one first peripheral contact is electrically floating.

19. The power component of claim 15, wherein said at least one second peripheral contact is electrically floating.

20. The power component of claim 15, wherein said component substrate comprises a dielectric layer situated between conductive layers.

* * * * *